(12) United States Patent
Chen et al.

(10) Patent No.: US 11,362,235 B2
(45) Date of Patent: Jun. 14, 2022

(54) SUBSTRATE STRUCTURING METHODS

(71) Applicant: Applied Materials, Inc., Santa Clara, CA (US)

(72) Inventors: Han-Wen Chen, Cupertino, CA (US); Steven Verhaverbeke, San Francisco, CA (US); Giback Park, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/227,763

(22) Filed: Apr. 12, 2021

(65) Prior Publication Data

US 2021/0234060 A1    Jul. 29, 2021

Related U.S. Application Data

(63) Continuation of application No. 16/687,564, filed on Nov. 18, 2019, now Pat. No. 11,063,169.

(30) Foreign Application Priority Data

May 10, 2019    (IT) .......................... 102019000006740

(51) Int. Cl.
*H01L 31/18*    (2006.01)
*H01L 21/304*    (2006.01)
(Continued)

(52) U.S. Cl.
CPC ...... *H01L 31/1804* (2013.01); *H01L 21/0275* (2013.01); *H01L 21/3046* (2013.01);
(Continued)

(58) Field of Classification Search
CPC ............. H01L 31/1804; H01L 21/0275; H01L 21/3046; H01L 21/30621; H01L 21/3086;
(Continued)

(56) References Cited

U.S. PATENT DOCUMENTS

| 4,073,610 | A | 2/1978 | Cox |
| 5,126,016 | A | 6/1992 | Glenning et al. |

(Continued)

FOREIGN PATENT DOCUMENTS

| CA | 2481616 C | 1/2013 |
| CN | 1971894 A | 5/2007 |

(Continued)

OTHER PUBLICATIONS

International Search Report and Written Opinion dated Oct. 7, 2021 for Application No. PCT/US2021037375.

(Continued)

*Primary Examiner* — Earl N Taylor
(74) *Attorney, Agent, or Firm* — Patterson & Sheridan, LLP (57) ABSTRACT

The present disclosure relates to methods and apparatus for structuring a semiconductor substrate. In one embodiment, a method of substrate structuring includes applying a resist layer to a substrate optionally disposed on a carrier. The resist layer is patterned using ultraviolet radiation or laser ablation. The patterned portions of the resist layer are then transferred onto the substrate by micro-blasting to form desired features in the substrate while unexposed or un-ablated portions of the resist layer shield the rest of the substrate. The substrate is then exposed to an etch process and a de-bonding process to remove the resist layer and release the carrier.

20 Claims, 6 Drawing Sheets

(51) Int. Cl.
*H01L 21/306* (2006.01)
*H01L 21/308* (2006.01)
*H01L 21/768* (2006.01)
*H01L 21/027* (2006.01)

(52) U.S. Cl.
CPC .... *H01L 21/3086* (2013.01); *H01L 21/30621* (2013.01); *H01L 21/76898* (2013.01); *H01L 31/1892* (2013.01); *H01L 2221/68345* (2013.01); *Y02E 10/547* (2013.01)

(58) Field of Classification Search
CPC .......... H01L 21/76898; H01L 31/1892; H01L 2221/68345; H01L 21/6835; H01L 23/49827; H01L 21/486; Y02E 10/547
See application file for complete search history.

(56) References Cited

U.S. PATENT DOCUMENTS

| | | |
|---|---|---|
| 5,268,194 A | 12/1993 | Kawakami et al. |
| 5,353,195 A | 10/1994 | Fillion et al. |
| 5,367,143 A | 11/1994 | White, Jr. |
| 5,374,788 A | 12/1994 | Endoh et al. |
| 5,474,834 A | 12/1995 | Tanahashi et al. |
| 5,670,262 A | 9/1997 | Dalman |
| 5,767,480 A | 6/1998 | Anglin et al. |
| 5,783,870 A | 7/1998 | Mostafazadeh et al. |
| 5,841,102 A | 11/1998 | Noddin |
| 5,878,485 A | 3/1999 | Wood et al. |
| 6,039,889 A | 3/2000 | Zhang et al. |
| 6,087,719 A | 7/2000 | Tsunashima |
| 6,117,704 A | 9/2000 | Yamaguchi et al. |
| 6,211,485 B1 | 4/2001 | Burgess |
| 6,384,473 B1 | 5/2002 | Peterson et al. |
| 6,388,202 B1 | 5/2002 | Swirbel et al. |
| 6,388,207 B1 | 5/2002 | Figueroa et al. |
| 6,459,046 B1 | 10/2002 | Ochi et al. |
| 6,465,084 B1 | 10/2002 | Curcio et al. |
| 6,489,670 B1 | 12/2002 | Peterson et al. |
| 6,495,895 B1 | 12/2002 | Peterson et al. |
| 6,506,632 B1 | 1/2003 | Cheng et al. |
| 6,512,182 B2 | 1/2003 | Takeuchi et al. |
| 6,538,312 B1 | 3/2003 | Peterson et al. |
| 6,555,906 B2 | 4/2003 | Towle et al. |
| 6,576,869 B1 | 6/2003 | Gower et al. |
| 6,593,240 B1 | 7/2003 | Page |
| 6,631,558 B2 | 10/2003 | Burgess |
| 6,661,084 B1 | 12/2003 | Peterson et al. |
| 6,713,719 B1 | 3/2004 | De Steur et al. |
| 6,724,638 B1 | 4/2004 | Inagaki et al. |
| 6,775,907 B1 | 8/2004 | Boyko et al. |
| 6,781,093 B2 | 8/2004 | Conlon et al. |
| 6,799,369 B2 | 10/2004 | Ochi et al. |
| 6,894,399 B2 | 5/2005 | Vu et al. |
| 7,028,400 B1 | 4/2006 | Hiner et al. |
| 7,062,845 B2 | 6/2006 | Burgess |
| 7,064,069 B2 | 6/2006 | Draney et al. |
| 7,078,788 B2 | 7/2006 | Vu et al. |
| 7,091,589 B2 | 8/2006 | Mori et al. |
| 7,091,593 B2 | 8/2006 | Ishimaru et al. |
| 7,105,931 B2 | 9/2006 | Attarwala |
| 7,129,117 B2 | 10/2006 | Hsu |
| 7,166,914 B2 | 1/2007 | DiStefano et al. |
| 7,170,152 B2 | 1/2007 | Huang et al. |
| 7,192,807 B1 | 3/2007 | Huemoeller et al. |
| 7,211,899 B2 | 5/2007 | Taniguchi et al. |
| 7,271,012 B2 | 9/2007 | Anderson |
| 7,274,099 B2 | 9/2007 | Hsu |
| 7,276,446 B2 | 10/2007 | Robinson et al. |
| 7,279,357 B2 | 10/2007 | Shimoishizaka et al. |
| 7,312,405 B2 | 12/2007 | Hsu |
| 7,321,164 B2 | 1/2008 | Hsu |
| 7,449,363 B2 | 11/2008 | Hsu |
| 7,458,794 B2 | 12/2008 | Schwaighofer et al. |
| 7,511,365 B2 | 3/2009 | Wu et al. |
| 7,690,109 B2 | 4/2010 | Mori et al. |
| 7,714,431 B1 | 5/2010 | Huemoeller et al. |
| 7,723,838 B2 | 5/2010 | Takeuchi et al. |
| 7,754,530 B2 | 7/2010 | Wu et al. |
| 7,808,799 B2 | 10/2010 | Kawabe et al. |
| 7,839,649 B2 | 11/2010 | Hsu |
| 7,843,064 B2 | 11/2010 | Kuo et al. |
| 7,852,634 B2 | 12/2010 | Sakamoto et al. |
| 7,855,460 B2 | 12/2010 | Kuwajima |
| 7,868,464 B2 | 1/2011 | Kawabata et al. |
| 7,887,712 B2 | 2/2011 | Boyle et al. |
| 7,914,693 B2 | 3/2011 | Jeong et al. |
| 7,915,737 B2 | 3/2011 | Nakasato et al. |
| 7,932,595 B1 | 4/2011 | Huemoeller et al. |
| 7,932,608 B2 | 4/2011 | Tseng et al. |
| 7,955,942 B2 | 6/2011 | Pagaila et al. |
| 7,978,478 B2 | 7/2011 | Inagaki et al. |
| 7,982,305 B1 | 7/2011 | Railkar et al. |
| 7,988,446 B2 | 8/2011 | Yeh et al. |
| 8,069,560 B2 | 12/2011 | Mori et al. |
| 8,137,497 B2 | 3/2012 | Sunohara et al. |
| 8,283,778 B2 | 10/2012 | Trezza |
| 8,314,343 B2 | 11/2012 | Inoue et al. |
| 8,367,943 B2 | 2/2013 | Wu et al. |
| 8,384,203 B2 | 2/2013 | Toh et al. |
| 8,390,125 B2 | 3/2013 | Tseng et al. |
| 8,426,246 B2 | 4/2013 | Toh et al. |
| 8,476,769 B2 | 7/2013 | Chen et al. |
| 8,518,746 B2 | 8/2013 | Pagaila et al. |
| 8,536,695 B2 | 9/2013 | Liu et al. |
| 8,628,383 B2 | 1/2014 | Starling et al. |
| 8,633,397 B2 | 1/2014 | Jeong et al. |
| 8,698,293 B2 | 4/2014 | Otremba et al. |
| 8,704,359 B2 | 4/2014 | Tuominen et al. |
| 8,710,402 B2 | 4/2014 | Lei et al. |
| 8,710,649 B1 | 4/2014 | Huemoeller et al. |
| 8,728,341 B2 | 5/2014 | Ryuzaki et al. |
| 8,772,087 B2 | 7/2014 | Barth et al. |
| 8,786,098 B2 | 7/2014 | Wang |
| 8,877,554 B2 | 11/2014 | Tsai et al. |
| 8,890,628 B2 | 11/2014 | Nair et al. |
| 8,907,471 B2 | 12/2014 | Beyne et al. |
| 8,921,995 B1 | 12/2014 | Railkar et al. |
| 8,952,544 B2 | 2/2015 | Lin et al. |
| 8,980,691 B2 | 3/2015 | Lin |
| 8,990,754 B2 | 3/2015 | Bird et al. |
| 8,994,185 B2 | 3/2015 | Lin et al. |
| 8,999,759 B2 | 4/2015 | Chia |
| 9,059,186 B2 | 6/2015 | Shim et al. |
| 9,064,936 B2 | 6/2015 | Lin et al. |
| 9,070,637 B2 | 6/2015 | Yoda et al. |
| 9,099,313 B2 | 8/2015 | Lee et al. |
| 9,111,914 B2 | 8/2015 | Lin et al. |
| 9,142,487 B2 | 9/2015 | Toh et al. |
| 9,159,678 B2 | 10/2015 | Cheng et al. |
| 9,161,453 B2 | 10/2015 | Koyanagi |
| 9,210,809 B2 | 12/2015 | Mallik et al. |
| 9,224,674 B2 | 12/2015 | Malatkar et al. |
| 9,275,934 B2 | 3/2016 | Sundaram et al. |
| 9,318,376 B1 | 4/2016 | Holm et al. |
| 9,355,881 B2 | 5/2016 | Goller et al. |
| 9,363,898 B2 | 6/2016 | Tuominen et al. |
| 9,396,999 B2 | 7/2016 | Yap et al. |
| 9,406,645 B1 | 8/2016 | Huemoeller et al. |
| 9,499,397 B2 | 11/2016 | Bowles et al. |
| 9,530,752 B2 | 12/2016 | Nikitin et al. |
| 9,554,469 B2 | 1/2017 | Hurwitz et al. |
| 9,660,037 B1 | 5/2017 | Zechmann et al. |
| 9,698,104 B2 | 7/2017 | Yap et al. |
| 9,704,726 B2 | 7/2017 | Toh et al. |
| 9,735,134 B2 | 8/2017 | Chen |
| 9,748,167 B1 | 8/2017 | Lin |
| 9,754,849 B2 | 9/2017 | Huang et al. |
| 9,837,352 B2 | 12/2017 | Chang et al. |
| 9,837,484 B2 | 12/2017 | Jung et al. |
| 9,859,258 B2 | 1/2018 | Chen et al. |
| 9,875,970 B2 | 1/2018 | Yi et al. |
| 9,887,103 B2 | 2/2018 | Scanlan et al. |

(56) References Cited

U.S. PATENT DOCUMENTS

| | | |
|---|---|---|
| 9,887,167 B1 | 2/2018 | Lee et al. |
| 9,893,045 B2 | 2/2018 | Pagaila et al. |
| 9,978,720 B2 | 5/2018 | Theuss et al. |
| 9,997,444 B2 | 6/2018 | Meyer et al. |
| 10,014,292 B2 | 7/2018 | Or-Bach et al. |
| 10,037,975 B2 | 7/2018 | Hsieh et al. |
| 10,053,359 B2 | 8/2018 | Bowles et al. |
| 10,090,284 B2 | 10/2018 | Chen et al. |
| 10,109,588 B2 | 10/2018 | Jeong et al. |
| 10,128,177 B2 | 11/2018 | Kamgaing et al. |
| 10,153,219 B2 | 12/2018 | Jeon et al. |
| 10,163,803 B1 | 12/2018 | Chen et al. |
| 10,170,386 B2 | 1/2019 | Kang et al. |
| 10,177,083 B2 | 1/2019 | Kim et al. |
| 10,211,072 B2 | 2/2019 | Chen et al. |
| 10,229,827 B2 | 3/2019 | Chen et al. |
| 10,256,180 B2 | 4/2019 | Liu et al. |
| 10,269,773 B1 | 4/2019 | Yu et al. |
| 10,297,518 B2 | 5/2019 | Lin et al. |
| 10,297,586 B2 | 5/2019 | Or-Bach et al. |
| 10,304,765 B2 | 5/2019 | Chen et al. |
| 10,347,585 B2 | 7/2019 | Shin et al. |
| 10,410,971 B2 | 9/2019 | Rae et al. |
| 10,424,530 B1 | 9/2019 | Alur et al. |
| 10,515,912 B2 | 12/2019 | Lim et al. |
| 10,522,483 B2 | 12/2019 | Shuto |
| 10,553,515 B2 | 2/2020 | Chew |
| 10,570,257 B2 | 2/2020 | Sun et al. |
| 10,658,337 B2 | 5/2020 | Yu et al. |
| 2001/0020548 A1 | 9/2001 | Burgess |
| 2001/0030059 A1 | 10/2001 | Sugaya et al. |
| 2002/0036054 A1 | 3/2002 | Nakatani et al. |
| 2002/0048715 A1 | 4/2002 | Walczynski |
| 2002/0070443 A1 | 6/2002 | Mu et al. |
| 2002/0074615 A1 | 6/2002 | Honda |
| 2002/0135058 A1 | 9/2002 | Asahi et al. |
| 2002/0158334 A1 | 10/2002 | Vu et al. |
| 2002/0170891 A1 | 11/2002 | Boyle et al. |
| 2003/0059976 A1 | 3/2003 | Nathan et al. |
| 2003/0221864 A1 | 12/2003 | Bergstedt et al. |
| 2003/0222330 A1 | 12/2003 | Sun et al. |
| 2004/0080040 A1 | 4/2004 | Dotta et al. |
| 2004/0118824 A1 | 6/2004 | Burgess |
| 2004/0134682 A1 | 7/2004 | En et al. |
| 2004/0248412 A1 | 12/2004 | Liu et al. |
| 2005/0012217 A1 | 1/2005 | Mori et al. |
| 2005/0170292 A1 | 8/2005 | Tsai et al. |
| 2006/0014532 A1 | 1/2006 | Seligmann et al. |
| 2006/0073234 A1 | 4/2006 | Williams |
| 2006/0128069 A1 | 6/2006 | Hsu |
| 2006/0145328 A1 | 7/2006 | Hsu |
| 2006/0160332 A1 | 7/2006 | Gu et al. |
| 2006/0270242 A1 | 11/2006 | Verhaverbeke et al. |
| 2006/0283716 A1 | 12/2006 | Hafezi et al. |
| 2007/0035033 A1 | 2/2007 | Ozguz et al. |
| 2007/0042563 A1 | 2/2007 | Wang et al. |
| 2007/0077865 A1 | 4/2007 | Dysard et al. |
| 2007/0111401 A1 | 5/2007 | Kataoka et al. |
| 2007/0130761 A1 | 6/2007 | Kang et al. |
| 2008/0006945 A1 | 1/2008 | Lin et al. |
| 2008/0011852 A1 | 1/2008 | Gu et al. |
| 2008/0090095 A1 | 4/2008 | Nagata et al. |
| 2008/0113283 A1 | 5/2008 | Ghoshal et al. |
| 2008/0119041 A1 | 5/2008 | Magera et al. |
| 2008/0173792 A1 | 7/2008 | Yang et al. |
| 2008/0173999 A1 | 7/2008 | Chung et al. |
| 2008/0296273 A1 | 12/2008 | Lei et al. |
| 2009/0084596 A1 | 4/2009 | Inoue et al. |
| 2009/0243065 A1 | 10/2009 | Sugino et al. |
| 2009/0250823 A1 | 10/2009 | Racz et al. |
| 2009/0278126 A1 | 11/2009 | Yang et al. |
| 2010/0013081 A1 | 1/2010 | Toh et al. |
| 2010/0062287 A1 | 3/2010 | Beresford et al. |
| 2010/0144101 A1 | 6/2010 | Chow et al. |
| 2010/0148305 A1 | 6/2010 | Yun |
| 2010/0160170 A1 | 6/2010 | Horimoto et al. |
| 2010/0248451 A1 | 9/2010 | Pirogovsky et al. |
| 2010/0264538 A1 | 10/2010 | Swinnen et al. |
| 2010/0301023 A1 | 12/2010 | Unrath et al. |
| 2010/0307798 A1 | 12/2010 | Izadian |
| 2011/0062594 A1 | 3/2011 | Maekawa et al. |
| 2011/0097432 A1 | 4/2011 | Yu et al. |
| 2011/0111300 A1 | 5/2011 | DelHagen et al. |
| 2011/0204505 A1 | 8/2011 | Pagaila et al. |
| 2011/0259631 A1 | 10/2011 | Rumsby |
| 2011/0291293 A1 | 12/2011 | Tuominen et al. |
| 2011/0304024 A1 | 12/2011 | Renna |
| 2011/0316147 A1 | 12/2011 | Shih et al. |
| 2012/0128891 A1 | 5/2012 | Takei et al. |
| 2012/0146209 A1 | 6/2012 | Hu et al. |
| 2012/0164827 A1* | 6/2012 | Rajagopalan ..... H01L 21/67109 438/667 |
| 2012/0261805 A1 | 10/2012 | Sundaram et al. |
| 2013/0074332 A1 | 3/2013 | Suzuki |
| 2013/0105329 A1 | 5/2013 | Matejat et al. |
| 2013/0196501 A1 | 8/2013 | Sulfridge |
| 2013/0203190 A1 | 8/2013 | Reed et al. |
| 2013/0286615 A1 | 10/2013 | Inagaki et al. |
| 2013/0341738 A1 | 12/2013 | Reinmuth et al. |
| 2014/0054075 A1 | 2/2014 | Hu |
| 2014/0092519 A1 | 4/2014 | Yang |
| 2014/0094094 A1 | 4/2014 | Rizzuto et al. |
| 2014/0103499 A1 | 4/2014 | Andry et al. |
| 2014/0252655 A1 | 9/2014 | Tran et al. |
| 2014/0353019 A1 | 12/2014 | Arora et al. |
| 2015/0228416 A1 | 8/2015 | Hurwitz et al. |
| 2015/0296610 A1 | 10/2015 | Daghighian et al. |
| 2015/0311093 A1 | 10/2015 | Li et al. |
| 2015/0359098 A1 | 12/2015 | Ock |
| 2015/0380356 A1 | 12/2015 | Chauhan et al. |
| 2016/0013135 A1 | 1/2016 | He et al. |
| 2016/0020163 A1 | 1/2016 | Shimizu et al. |
| 2016/0049371 A1 | 2/2016 | Lee et al. |
| 2016/0088729 A1 | 3/2016 | Kobuke et al. |
| 2016/0095203 A1 | 3/2016 | Min et al. |
| 2016/0118337 A1 | 4/2016 | Yoon et al. |
| 2016/0270242 A1 | 9/2016 | Kim et al. |
| 2016/0276325 A1 | 9/2016 | Nair et al. |
| 2016/0329299 A1 | 11/2016 | Lin et al. |
| 2016/0336296 A1 | 11/2016 | Jeong et al. |
| 2017/0047308 A1 | 2/2017 | Ho et al. |
| 2017/0064835 A1 | 3/2017 | Ishihara et al. |
| 2017/0223842 A1 | 8/2017 | Chujo et al. |
| 2017/0229432 A1 | 8/2017 | Lin et al. |
| 2017/0338254 A1 | 11/2017 | Reit et al. |
| 2018/0019197 A1 | 1/2018 | Boyapati et al. |
| 2018/0116057 A1 | 4/2018 | Kajihara et al. |
| 2018/0182727 A1 | 6/2018 | Yu |
| 2018/0197831 A1 | 7/2018 | Kim et al. |
| 2018/0204802 A1 | 7/2018 | Lin et al. |
| 2018/0308792 A1 | 10/2018 | Raghunathan et al. |
| 2018/0352658 A1 | 12/2018 | Yang |
| 2018/0374696 A1 | 12/2018 | Chen et al. |
| 2018/0376589 A1 | 12/2018 | Harazono |
| 2019/0088603 A1 | 3/2019 | Marimuthu et al. |
| 2019/0131224 A1 | 5/2019 | Choi et al. |
| 2019/0131270 A1 | 5/2019 | Lee et al. |
| 2019/0131284 A1 | 5/2019 | Jeng et al. |
| 2019/0189561 A1 | 6/2019 | Rusli |
| 2019/0229046 A1 | 7/2019 | Tsai et al. |
| 2019/0237430 A1 | 8/2019 | England |
| 2019/0285981 A1 | 9/2019 | Cunningham et al. |
| 2019/0306988 A1 | 10/2019 | Grober et al. |
| 2019/0355680 A1 | 11/2019 | Chuang et al. |
| 2019/0369321 A1 | 12/2019 | Young et al. |
| 2020/0003936 A1 | 1/2020 | Fu et al. |
| 2020/0039002 A1 | 2/2020 | Sercel et al. |
| 2020/0130131 A1 | 4/2020 | Togawa et al. |

(56) References Cited

U.S. PATENT DOCUMENTS

| | | | |
|---|---|---|---|
| 2020/0357947 | A1* | 11/2020 | Chen .................. H01L 21/486 |
| 2020/0358163 | A1 | 11/2020 | See et al. |

FOREIGN PATENT DOCUMENTS

| | | |
|---|---|---|
| CN | 100463128 C | 2/2009 |
| CN | 100502040 C | 6/2009 |
| CN | 100524717 C | 8/2009 |
| CN | 100561696 C | 11/2009 |
| CN | 104637912 A | 5/2015 |
| CN | 105436718 A | 3/2016 |
| CN | 106531647 A | 3/2017 |
| CN | 106653703 A | 5/2017 |
| CN | 108028225 A | 5/2018 |
| CN | 111492472 A | 8/2020 |
| EP | 0264134 A2 | 4/1988 |
| EP | 1536673 A1 | 6/2005 |
| EP | 1478021 B1 | 7/2008 |
| EP | 1845762 B1 | 5/2011 |
| EP | 2942808 A1 | 11/2015 |
| JP | 2001244591 A | 9/2001 |
| JP | 2002246755 A | 8/2002 |
| JP | 2003188340 A | 7/2003 |
| JP | 2004311788 A | 11/2004 |
| JP | 2004335641 A | 11/2004 |
| JP | 4108285 B2 | 6/2008 |
| JP | 2012069926 A | 4/2012 |
| JP | 5004378 B2 | 8/2012 |
| JP | 5111342 B2 | 1/2013 |
| JP | 5693977 B2 | 4/2015 |
| JP | 5700241 B2 | 4/2015 |
| JP | 5981232 B2 | 8/2016 |
| JP | 6394136 B2 | 9/2018 |
| JP | 6542616 B2 | 7/2019 |
| JP | 6626697 B2 | 12/2019 |
| KR | 100714196 B1 | 5/2007 |
| KR | 100731112 B1 | 6/2007 |
| KR | 10-2008-0037296 A | 4/2008 |
| KR | 2008052491 A | 6/2008 |
| KR | 20100097893 A | 9/2010 |
| KR | 101301507 B1 | 9/2013 |
| KR | 20140086375 A | 7/2014 |
| KR | 101494413 B1 | 2/2015 |
| KR | 20160013706 A | 2/2016 |
| KR | 20180113885 A | 10/2018 |
| KR | 101922884 B1 | 11/2018 |
| KR | 101975302 B1 | 8/2019 |
| KR | 102012443 B1 | 8/2019 |
| TW | I594397 B | 8/2017 |
| WO | 2011130300 A1 | 10/2011 |
| WO | WO-2011130300 A1 * | 10/2011 ............... B24C 1/04 |
| WO | 2013008415 A1 | 1/2013 |
| WO | 2013126927 A2 | 8/2013 |
| WO | 2015126438 A1 | 8/2015 |
| WO | 2017111957 A1 | 6/2017 |
| WO | 2018013122 A1 | 1/2018 |
| WO | 2018125184 A1 | 7/2018 |
| WO | 2019023213 A1 | 1/2019 |
| WO | 2019066988 A1 | 4/2019 |
| WO | 2019/177742 A1 | 9/2019 |

OTHER PUBLICATIONS

PCT International Search Report and Written Opinion dated Oct. 19, 2021, for International Application No. PCT/US2021/038690.
PCT International Search Report and Written Opinion dated Feb. 4, 2022, for International Application No. PCT/US2021/053830.
PCT International Search Report and Written Opinion dated Feb. 4, 2022, for International Application No. PCT/US2021/053821.
Lannon, John Jr., et al.—"Fabrication and Testing of a TSV-Enabled Si Interposer with Cu- and Polymer-Based Multilevel Metallization," IEEE Transactions on Components, Packaging and Manufacturing Technology, vol. 4, No. 1, Jan. 2014, pp. 153-157.
Malta, D., et al.—"Fabrication of TSV-Based Silicon Interposers," 3D Systems Integration Conference (3DIC), 2010 IEEE International, Nov. 16-18, 2010, 6 pages.
Allresist Gmbh—Strausberg et al: "Resist-Wiki: Adhesion promoter HMDS and diphenylsilanedio (AR 300-80)- . . . -ALLRESIST GmbH—Strausberg, Germany", Apr. 12, 2019 (Apr. 12, 2019), XP055663206, Retrieved from the Internet: URL:https://web.archive.org/web/20190412 20micals-adhesion-promoter-hmds-and-diphenyl2908/https://www.allresist.com/process-chemicals-adhesion-promoter-hmds-and-diphenylsilanedio/, [retrieved on Jan. 29, 2020].
Amit Kelkar, et al. "Novel Mold-free Fan-out Wafer Level Package using Silicon Wafer", IMAPS 2016—49th International Symposium on Microelectronics—Pasadena, CA USA—Oct. 10-13, 2016, 5 pages. (IMAPS 2016—49th International Symposium on Microelectronics—Pasadena, CA USA—Oct. 10-13, 2016, 5 pages.).
Arifur Rahman. "System-Level Performance Evaluation of Three-Dimensional Integrated Circuits", vol. 8, No. 6, Dec. 2000. pp. 671-678.
Baier, T. et al., Theoretical Approach to Estimate Laser Process Parameters for Drilling in Crystalline Silicon, Prog. Photovolt: Res. Appl. 18 (2010) 603-606, 5 pages.
Chien-Wei Chien et al. "Chip Embedded Wafer Level Packaging Technology for Stacked RF-SiP Application",2007 IEEE, pp. 305-310.
Chien-Wei Chien et al. "3D Chip Stack With Wafer Through Hole Technology". 6 pages.
Doany, F.E., et al.—"Laser release process to obtain freestanding multilayer metal-polyimide circuits," IBM Journal of Research and Development, vol. 41, Issue 1/2, Jan./Mar. 1997, pp. 151-157.
Dyer, P.E., et al.—"Nanosecond photoacoustic studies on ultraviolet laser ablation of organic polymers," Applied Physics Letters, vol. 48, No. 6, Feb. 10, 1986, pp. 445-447.
Han et al.—"Process Feasibility and Reliability Performance of Fine Pitch Si Bare Chip Embedded in Through Cavity of Substrate Core," IEEE Trans. Components, Packaging and Manuf. Tech., vol. 5, No. 4, pp. 551-561, 2015. [Han et al. IEEE Trans. Components, Packaging and Manuf. Tech., vol. 5, No. 4, pp. 551-561, 2015.].
Han et al.—"Through Cavity Core Device Embedded Substrate for Ultra-Fine-Pitch Si Bare Chips; (Fabrication feasibility and residual stress evaluation)", ICEP-IAAC, 2015, pp. 174-179. [Han et al., ICEP-IAAC, 2015, pp. 174-179.].
Han, Younggun, et al.—"Evaluation of Residual Stress and Warpage of Device Embedded Substrates with Piezo-Resistive Sensor Silicon Chips" technical paper, Jul. 31, 2015, pp. 81-94.
International Search Report and the Written Opinion for International Application No. PCT/US2019/064280 dated Mar. 20, 2020, 12 pages.
International Search Report and Written Opinion for Application No. PCT/US2020/026832 dated Jul. 23, 2020.
Italian search report and written opinion for Application No. IT 201900006736 dated Mar. 2, 2020.
Italian Search Report and Written Opinion for Application No. IT 201900006740 dated Mar. 4, 2020.
Junghoon Yeom', et al. "Critical Aspect Ratio Dependence in Deep Reactive Ion Etching of Silicon", 2003 IEEE. pp. 1631-1634.
K. Sakuma et al. "3D Stacking Technology with Low-Volume Lead-Free Interconnections", IBM T.J. Watson Research Center. 2007 IEEE, pp. 627-632.
Kenji Takahashi et al. "Current Status of Research and Development for Three-Dimensional Chip Stack Technology", Jpn. J. Appl. Phys. vol. 40 (2001) pp. 3032-3037, Part 1, No. 4B, Apr. 2001. 6 pages.
Kim et al. "A Study on the Adhesion Properties of Reactive Sputtered Molybdenum Thin Films with Nitrogen Gas on Polyimide Substrate as a Cu Barrier Layer," 2015, Journal of Nanoscience and Nanotechnology, vol. 15, No. 11, pp. 8743-8748, doi: 10.1166/jnn.2015.11493.
Knickerbocker, J.U., et al.—"Development of next-generation system-on-package (SOP) technology based on silicon carriers with fine-pitch chip interconnection," IBM Journal of Research and Development, vol. 49, Issue 4/5, Jul./Sep. 2005, pp. 725-753.

(56) References Cited

OTHER PUBLICATIONS

Knickerbocker, John U., et al.—"3-D Silicon Integration and Silicon Packaging Technology Using Silicon Through-Vias," IEEE Journal of Solid-State Circuits, vol. 41, No. 8, Aug. 2006, pp. 1718-1725.
Knorz, A. et al., High Speed Laser Drilling: Parameter Evaluation and Characterisation, Presented at the 25th European PV Solar Energy Conference and Exhibition, Sep. 6-10, 2010, Valencia, Spain, 7 pages.
L. Wang, et al. "High aspect ratio through-wafer interconnections for 3Dmicrosystems", 2003 IEEE. pp. 634-637.
Lee et al. "Effect of sputtering parameters on the adhesion force of copper/molybdenum metal on polymer substrate," 2011, Current Applied Physics, vol. 11, pp. S12-S15, doi: 10.1016/j.cap.2011.06.019.
Liu, C.Y. et al., Time Resolved Shadowgraph Images of Silicon during Laser Ablation: Shockwaves and Particle Generation, Journal of Physics: Conference Series 59 (2007) 338-342, 6 pages.
Narayan, C., et al.—"Thin Film Transfer Process for Low Cost MCM's," Proceedings of 1993 IEEE/CHMT International Electronic Manufacturing Technology Symposium, Oct. 4-6, 1993, pp. 373-380.
NT Nguyen et al. "Through-Wafer Copper Electroplating for Three-Dimensional Interconnects", Journal of Micromechanics and Microengineering. 12 (2002) 395-399. 2002 IOP.
PCT International Search Report and Written Opinion dated Aug. 28, 2020, for International Application No. PCT/US2020/032245.
PCT International Search Report and Written Opinion dated Feb. 17, 2021 for International Application No. PCT/US2020/057787.
PCT International Search Report and Written Opinion dated Feb. 19, 2021, for International Application No. PCT/US2020/057788.
PCT International Search Report and Written Opinion dated Sep. 15, 2020, for International Application No. PCT/US2020/035778.
Ronald Hon et al. "Multi-Stack Flip Chip 3D Packaging with Copper Plated Through-Silicon Vertical Interconnection", 2005 IEEE. pp. 384-389.
S. W. Ricky Lee et al. "3D Stacked Flip Chip Packaging with Through Silicon Vias and Copper Plating or Conductive Adhesive Filling", 2005 IEEE, pp. 798-801.
Shen, Li-Cheng, et al.—"A Clamped Through Silicon Via (TSV) Interconnection for Stacked Chip Bonding Using Metal Cap on Pad and Metal Column Forming in Via," Proceedings of 2008 Electronic Components and Technology Conference, pp. 544-549.
Shi, Tailong, et al.—"First Demonstration of Panel Glass Fan-out (GFO) Packages for High I/O Density and High Frequency Multichip Integration," Proceedings of 2017 IEEE 67th Electronic Components and Technology Conference, May 30-Jun. 2, 2017, pp. 41-46.
Srinivasan, R., et al.—"Ultraviolet Laser Ablation of Organic Polymers," Chemical Reviews, 1989, vol. 89, No. 6, pp. 1303-1316.
Taiwan Office Action dated Oct. 27, 2020 for Application No. 108148588.
Trusheim, D. et al., Investigation of the Influence of Pulse Duration in Laser Processes for Solar Cells, Physics Procedia Dec. 2011, 278-285, 9 pages.
Wu et al., Microelect. Eng., vol. 87 2010, pp. 505-509.
Yu et al. "High Performance, High Density RDL for Advanced Packaging," 2018 IEEE 68th Electronic Components and Technology Conference, pp. 587-593, DOI 10.1109/ETCC.2018.0009.
Yu, Daquan—"Embedded Silicon Fan-out (eSiFO) Technology for Wafer-Level System Integration," Advances in Embedded and Fan-Out Wafer-Level Packaging Technologies, First Edition, edited by Beth Keser and Steffen Kroehnert, published 2019 by John Wiley & Sons, Inc., pp. 169-184.
U.S. Office Action dated May 13, 2021, in U.S. Appl. No. 16/870,843.
Chen, Qiao—"Modeling, Design and Demonstration of Through-Package-Vias in Panel-Based Polycrystalline Silicon Interposers for High Performance, High Reliability and Low Cost," a Dissertalion presented to the Academic Faculty, Georgia Institute of Technology, May 2015, 168 pages.

\* cited by examiner

SUBSTRATE STRUCTURING METHODS

CROSS-REFERENCE TO RELATED APPLICATIONS

This application is a continuation of U.S. patent application Ser. No. 16/687,564 filed Nov. 18, 2019, which claims priority to Italian patent application number 102019000006740, filed May 10, 2019, each of which is herein incorporated by reference in its entirety.

BACKGROUND

Field

Embodiments of the present disclosure generally relate to methods and apparatus for structuring semiconductor substrates. More specifically, embodiments described herein relate to methods and apparatus for structuring semiconductor substrates using micro-blasting and laser ablation techniques.

Description of the Related Art

Due to an ever-increasing demand for miniaturized electronic devices and components, integrated circuits have evolved into complex 2.5D and 3D devices that can include millions of transistors, capacitors, and resistors on a single chip. The evolution of chip design has resulted in greater circuit density to improve the process capability and speed of integrated circuits. The demand for faster processing capabilities with greater circuit densities imposes corresponding demands on the materials, structures, and processes used in the fabrication of such integrated circuit chips. Alongside these trends toward greater integration and performance, however, there exists the constant pursuit for reduced manufacturing costs.

Conventionally, integrated circuit chips have been fabricated on organic package substrates due to the ease of forming features and connections therethrough, as well as the relatively low package manufacturing costs associated with organic composites. However, as circuit densities are increased and electronic devices are further miniaturized, the utilization of organic package substrates becomes impractical due to limitations with material structuring resolution to sustain device scaling and associated performance requirements. More recently, 2.5D and 3D integrated circuits have been fabricated utilizing passive silicon interposers placed on organic package substrates as redistribution layers to compensate for some of the limitations associated with organic package substrates. Silicon interposer utilization is driven by the potential for high-bandwidth density, lower-power chip-to-chip communication, and heterogeneous integration requirements in advanced packaging applications. Yet, the formation of features in silicon interposers, such as through-silicon vias (TSVs), is still difficult and costly. In particular, high costs are imposed by high-aspect-ratio silicon via etching, chemical mechanical planarization, and semiconductor back end of line (BEOL) interconnection.

Therefore, what is needed in the art are improved methods of substrate structuring for advanced packaging applications.

SUMMARY

In one embodiment, a method for substrate structuring is provided. The method includes bonding a substrate to a carrier plate with a first adhesive layer, bonding a resist layer on the substrate with a second adhesive layer, and patterning the resist layer with electromagnetic radiation. The method further includes propelling powder particles against the patterned resist layer to form structured patterns in the substrate and exposing the substrate to an etch process to remove debris from the structured patterns and smoothen one or more surfaces thereof. The resist layer is de-bonded from the substrate by releasing the second adhesive layer and the substrate is de-bonded from the carrier plate by releasing the first adhesive layer.

In one embodiment, a method for substrate structuring is provided. The method includes forming a resist layer on a silicon solar substrate, patterning the resist layer by exposing the resist layer to electromagnetic radiation, propelling a stream of powder particles under high pressure towards the substrate to dislodge and remove material from the substrate and form structured patterns therein, and exposing the substrate to an etch process to remove debris from the structured patterns and smoothen one or more surfaces of the substrate.

In one embodiment, a method for substrate structuring is provided. The method includes bonding a first resist layer on a first surface of a substrate with a first adhesive layer, bonding a second resist layer on a second surface of the substrate with a second adhesive layer, and patterning the first resist layer and the second resist layer. The method further includes propelling powder particles towards the first surface of the substrate to form one or more patterned structures therein, propelling powder particles towards the second surface of the substrate to extend the one or more patterned structures across a thickness of the substrate between the first surface and the second surface, and exposing the substrate to an etch process to remove debris from the substrate and smoothen one or more surfaces thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to methods and apparatus for structuring a semiconductor substrate. In one embodiment, a method of substrate structuring includes applying a resist layer to a substrate optionally disposed on a carrier plate. The resist layer is patterned using ultraviolet radiation or laser ablation. The patterned portions of the resist layer are then transferred onto the substrate by micro-blasting while unexposed or un-ablated portions of the resist layer shield the remainder of the substrate. The substrate is then exposed to an etch process and a de-bonding process to remove the resist layer and release the carrier. In another embodiment, desired features are formed in the substrate by laser ablation.

Figure 1:
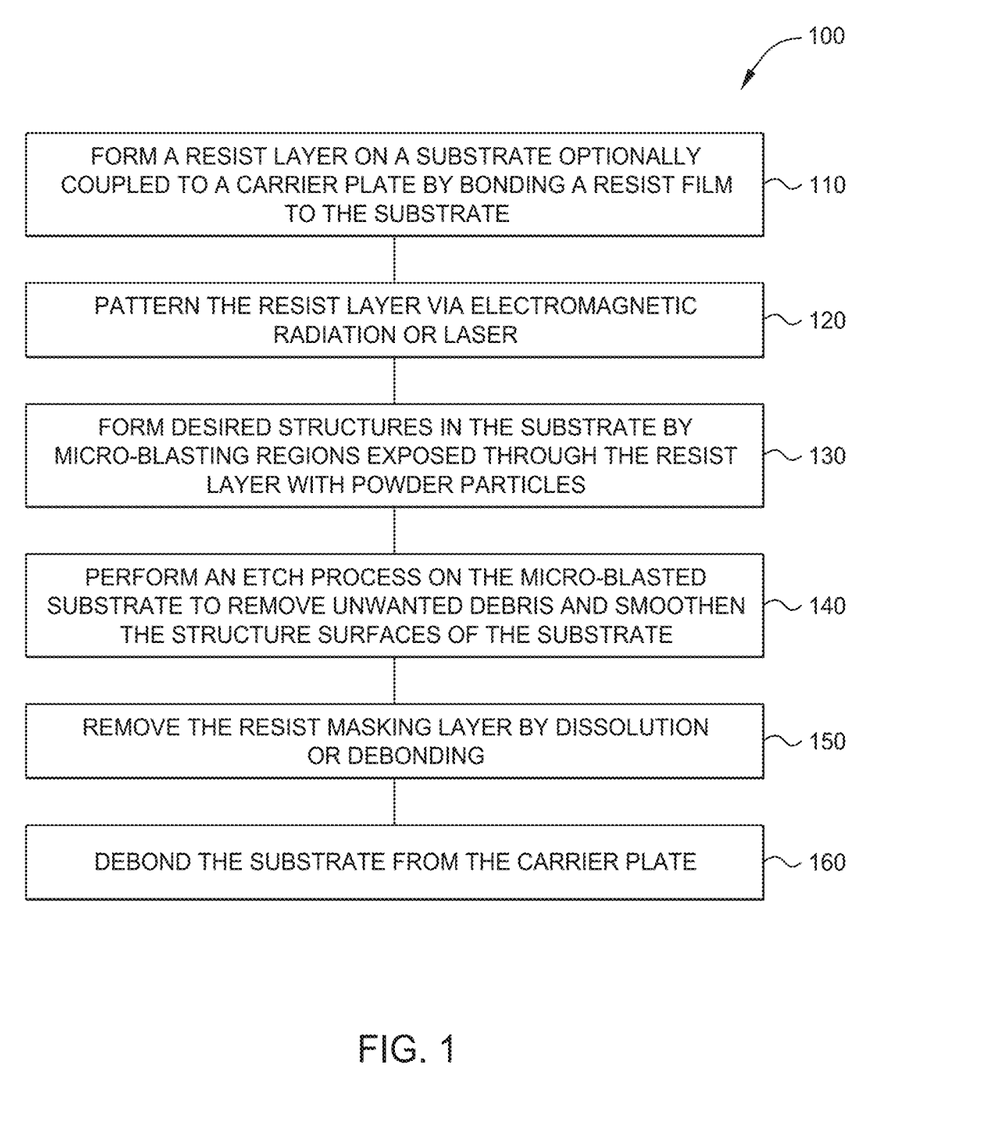
FIG. 1 illustrates a flow diagram of a substrate structuring process according to an embodiment described herein.

FIG. 1 illustrates a flow diagram of a representative method 100 for structuring a substrate 102. FIGS. 2A-2F and 3A-3F illustrate schematic, cross-sectional views of the substrate 102 at different stages of the structuring process of FIG. 1. Thus, reference to FIGS. 2A-2F and 3A-3F will be included in the discussion of FIG. 1 and the method 100 where warranted. Further, the method 100 for structuring the substrate 102 has multiple operations. The operations can be carried out in any order or simultaneously (except where the context excludes the possibility), and the method can include one or more other operations which are carried out before any of the defined operations, between two of the defined operations, or after all the defined operations (except where the context excludes the possibility).

In general, the method 100 includes applying a resist film to the substrate 102 at operation 110. In some embodiments, the substrate 102 is optionally coupled to a carrier plate prior to application of the resist film. At operation 120, the method 100 includes exposing the substrate 102 to electromagnetic or laser radiation to pattern the resist film. At operation 130, the substrate 102 is micro-blasted to form structures, such as blind vias, through vias, or cavities, in the substrate 102. The method further includes etching the substrate 102 to remove debris and surface micro-cracks formed during the micro-blasting process at operation 140, while the patterned resist film remains intact. Subsequently, the patterned resist layer is removed at operation 150, after which the substrate may be further exposed to a carrier plate de-bonding process at operation 160.

The substrate 102 is formed of any suitable substrate material including but not limited to a III-V compound semiconductor material, silicon, crystalline silicon (e.g., Si<100> or Si<111>), silicon oxide, silicon germanium, doped or undoped silicon, doped or undoped polysilicon, silicon nitride, quartz, borosilicate glass, glass, sapphire, alumina, and ceramic. In one embodiment, the substrate 102 is a packaging substrate. In one embodiment, the substrate 102 is a monocrystalline p-type or n-type silicon substrate. In one embodiment, the substrate 102 is a polycrystalline p-type or n-type silicon substrate. In another embodiment, the substrate 102 is a p-type or n-type silicon solar substrate. Unless otherwise noted, embodiments and examples described herein are performed with substrates having a thickness of between about 50 µm and about 1000 µm, such as between about 90 µm and about 780 µm. For example, the substrate 102 has a thickness of between about 100 µm and about 300 µm, such as a thickness of between about 110 µm and about 200 µm.

In embodiments where the substrate 102 has a thickness of less than about 200 µm, such as a thickness of about 50 µm, the substrate 102 is coupled to a carrier plate 106 during the substrate structuring process 100. The carrier plate 106 provides mechanical support for the substrate 102 during the substrate structuring process 100 and prevents the substrate 102 from breaking. The carrier plate 106 is formed of any suitable chemically and thermally stable rigid material including but not limited to glass, ceramic, metal, and the like. The carrier plate 106 has a thickness between about 1 mm and about 10 mm, such as a thickness between about 2 mm and about 5 mm. In one embodiment, the carrier plate 106 has a textured surface onto which the substrate 102 is coupled. In another embodiment, the carrier plate 106 has a polished surface onto which the substrate 102 is coupled.

In one embodiment, the substrate 102 is coupled to the carrier plate 106 via an adhesive layer 108. The adhesive layer 108 is formed of any suitable temporary bonding material including but not limited to wax, glue, and similar adhesives. The adhesive layer 108 may be applied onto the carrier plate 106 by mechanical rolling, pressing, lamination, spin coating, doctor-blading, or the like. In one embodiment, the adhesive layer 108 is a water- or solvent-soluble adhesive layer. In other embodiments, the adhesive layer 108 is a UV release adhesive layer. In still other embodiments, the adhesive layer 108 is a thermal release adhesive layer. In such embodiments, the bonding properties of the adhesive layer 108 degrade upon exposure to elevated temperatures, such as exposure to temperatures above 110° C., for example, temperatures above 150° C. The adhesive layer 108 may further include one or more layers of films (not shown) such as a liner, a thermal release adhesive film, a base film, a pressure-sensitive film, and other suitable layers.

Figure 2A:
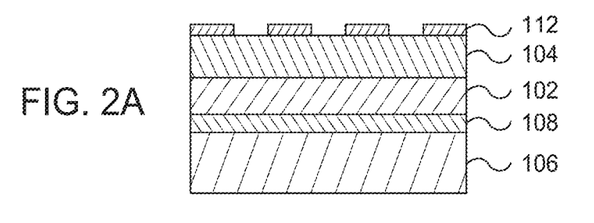
FIGS. 2A-2F schematically illustrate cross-sectional views of a substrate at different stages of a substrate structuring process according to an embodiment described herein.
Figure 3A:
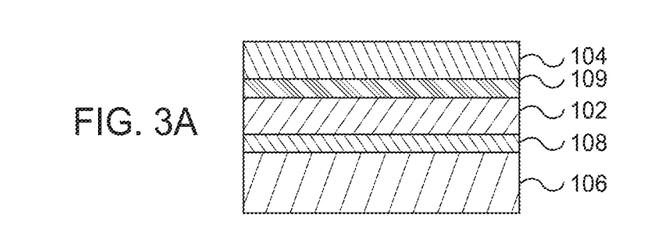
FIGS. 3A-3F schematically illustrate cross-sectional views of a substrate at different stages of a substrate structuring process according to an embodiment described herein.

At operation 110, corresponding to FIGS. 2A and 3A, a resist film is applied to the substrate 102 to form a resist layer 104. The resist layer 104 is used to transfer a desired pattern to the substrate 102 during subsequent processing operations. After being patterned at operation 120, the resist layer 104 protects selected regions of the underlying substrate 102 during the micro-blasting process at operation 130.

The substrate 102 has one or more substantially planar surfaces upon which the resist layer 104 may be formed. In one embodiment, such as the embodiment illustrated in FIG. 3A, the resist layer 104 is bonded to the substrate 102 via a resist adhesive layer 109. The resist adhesive layer 109 is formed from any suitable temporary bonding material, including but not limited to polyvinyl alcohol, triester with 2-ethyl-2-(hydroxymethyl)-1,3-propanediol, and other water- or solvent-soluble materials. In one embodiment, the resist adhesive layer 109 is formed from a different material than the adhesive layer 108. In one embodiment, the resist adhesive layer 109 is substantially similar in composition to the adhesive layer 108. The resist adhesive layer 109 may be applied onto the substrate 102 by mechanical rolling, pressing, lamination, spin coating, doctor-blading, or similar processes. In another embodiment, such as the one illustrated in FIG. 2A, the resist layer 104 is formed of a temporary bonding material such as polyvinyl alcohol, thus enabling the resist layer 104 to be directly applied and bonded to the surface of the substrate 102. The resist layer 104 may further include one or more layers, for example, a first resist layer and a second resist layer (not shown).

In one embodiment, such as the embodiment illustrated in FIG. 2A, the resist layer 104 is a photoresist. The resist layer 104 may include a solvent, a photoresist resin, and a photoacid generator. The photoresist resin may be any positive photoresist resin or any negative photoresist resin. Representative photoresist resins include acrylates, novolak resins, poly(methylmethacrylates), and poly(olefin sulfones). Other photoresist resins may also be used. Upon exposure to electromagnetic radiation, the photoacid generator generates charged species, such as acid cations and anions. The photoacid generator may also generate polarized species. The photoacid generator sensitizes the resin to electromagnetic radiation. Representative photoacid generators include sulfonate compounds, such as, for example, sulfonated salts, sulfonated esters, and sulfonyloxy ketones. Other suitable photoacid generators include onium salts, such as aryl-diazonium salts, halonium salts, aromatic sulfonium salts and sulfoxonium salts or selenium salts. Other representative photoacid generators include nitrobenzyl esters, s-triazine derivatives, ionic iodonium sulfonates, perfluoroalkanesulfonates, aryl triflates and derivatives and analogs thereof, pyrogallol derivatives, and alkyl disulfones. Other photoacid generators may also be used.

In one embodiment, such as the embodiment illustrated in FIG. 3A, the resist layer 104 is a laser-sensitive resist. The resist layer 104 may be formed of any material having a suitable hardness for laser ablation. For example, the resist layer 104 is formed of a material having a Shore A Scale hardness value of between about 40 and about 90, such as between about 60 and about 70. In one embodiment, the resist layer 104 is formed of a material having a Shore A Scale hardness value of about 65. In further embodiments, the resist layer 404 is formed of a material having a tensile strength of between about 0.5 MPa and about 10 MPa, such as between about 1 MPa and about 8 MPa. For example, the resist layer 104 is formed of a material having a tensile strength of about 7 MPa. In some embodiments, the resist layer 104 is formed of a polydimethylsiloxane material. In other embodiments, the laser-sensitive resist layer 104 is formed of polyvinyl alcohol, triester with 2-ethyl-2-(hydroxymethyl)-1,3-propanediol, or the like.

Figure 2B:
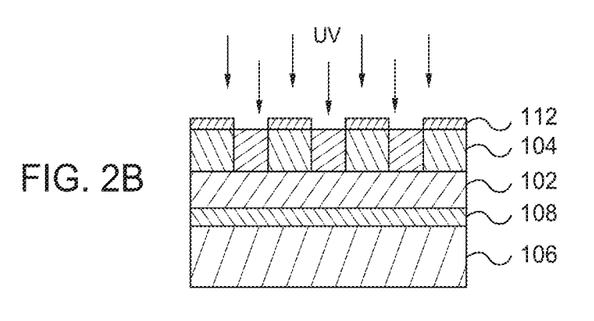
Figure 3B:
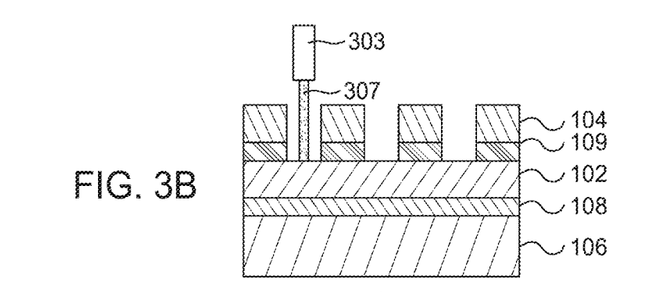

At operation 120, corresponding to FIGS. 2B and 3B, the substrate 102 having the resist layer 104 formed thereon is exposed to electromagnetic radiation to pattern the resist layer 104. In the embodiment illustrated by FIG. 2B, the substrate 102 having the resist layer 404 formed thereon is exposed to electromagnetic radiation in the ultraviolet (UV) range. Portions of the resist layer 104 are selectively exposed and portions of the resist layer 104 are selectively unexposed to the UV radiation. Upon exposure to the UV radiation, the selectively exposed portions of the resist layer 104 are structurally weakened while the selectively unexposed portions maintain their structural integrity, as depicted in FIG. 2B. In one embodiment, a mask 112 having a desired pattern is formed on or adjacent to the resist layer 104 prior to UV radiation exposure. In some embodiments, the mask 112 is a reticle positioned between the resist layer 104 and the UV radiation source. The mask 112 is configured to transfer a desired pattern of UV radiation to the resist layer 104 and is formed of any suitable polymeric materials, including but not limited to PTFE, PVDF, FEP, polyimide, or the like.

In the embodiment illustrated in FIG. 3B, the substrate 102 having a resist layer 104 formed thereon is exposed to electromagnetic radiation generated by a laser source 303 instead of a UV radiation source. As such, patterning is accomplished by targeted laser ablation without the use of a mask. The laser source 303 may be any suitable type of laser source for patterning of the laser-sensitive resist layer 104. In some examples, the laser source 303 is a femtosecond green laser. In other examples, the laser source 303 is a femtosecond UV laser. The laser source 303 generates a continuous or pulsed laser beam for patterning of the resist layer 104. For example, the laser source 303 may generate a pulsed laser beam having a frequency between about 100 kHz and about 1200 kHz, such as between about 200 kHz and about 1000 kHz. It is further contemplated that the electromagnetic radiation at operation 120 may alternatively or additionally include an electron beam or an ion beam in some embodiments.

Figure 2C:
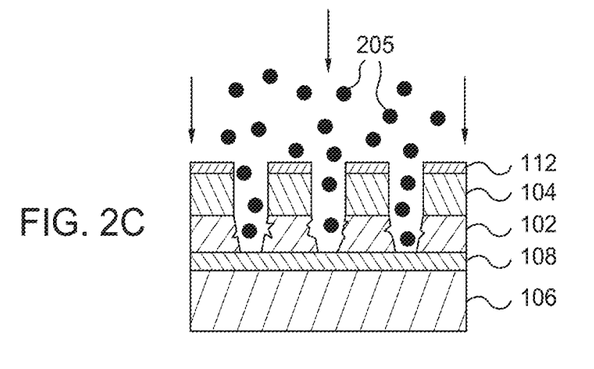
Figure 3C:
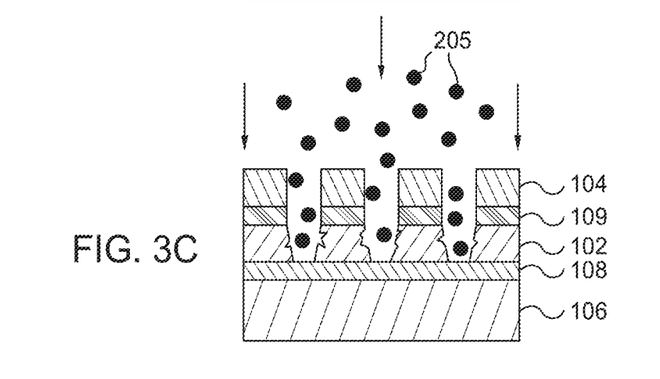

At operation 130, corresponding to FIGS. 2C and 3C, the substrate 102 having the resist layer 104 formed thereon is micro-blasted to form a desired pattern in the substrate 102. During the micro-blasting process, a stream of powder particles 205 is propelled toward the substrate 102 under high pressure to dislodge exposed portions of the substrate 102 and/or layers formed thereon. The micro-blasting process is performed using any suitable substrate abrading system. In one embodiment, the powder particles 205 are propelled using a fluid stream of inert gas, including but not limited to helium, argon, and nitrogen. In another embodiment, the powder particles 205 are propelled using a fluid stream of air.

The micro-blasting process is determined by the material properties of the powder particles 205, the momentum of the powder particles 205 that strike the exposed surface of the substrate 102, as well as the material properties of the substrate 102 along with, when applicable, the selectively-exposed portions of the resist layer 104. To achieve desired substrate patterning characteristics, adjustments are made to the type and size of the powder particles 205, the size and distance of the abrading system's applicator nozzle to the substrate 102, the pressure utilized to propel the powder particles 205, and the density of the powder particles 205 in the fluid stream. For example, a desired fluid pressure of the carrier gas used for propelling the powder particles 205 toward the substrate 102 for a desired fixed micro-blasting device nozzle orifice size may be determined based on the materials of the substrate 102 and the powder particles 205. In one embodiment, the fluid pressure utilized to micro-blast the substrate 102 generally ranges between about 50 psi and about 150 psi, such as between about 75 psi and about 125 psi, to achieve a carrier gas and particle velocity of between about 300 meters per second (m/s) and about 1000 m/s and/or a flow rate of between about 0.001 cubic meters per second ($m^3$/s) and about 0.002 $m^3$/s. For example, the fluid pressure of an inert gas (e.g., nitrogen ($N_2$), CDA, argon) that is utilized to propel the powder particles 205 during micro-blasting is about 95 psi to achieve a carrier gas and particle velocity of about 2350 m/s. In one embodiment, the applicator nozzle utilized to micro-blast the substrate 102 has an inner diameter of between about 0.1 millimeters (mm) and about 2.5 mm that is disposed at a distance between about 1 mm and about 5 mm from the substrate 102, such as between about 2 mm and about 4 mm. For example, the applicator nozzle is disposed at a distance of about 3 mm from the substrate 102 during micro-blasting.

Generally, the micro-blasting process is performed with powder particles 205 having a sufficient hardness and high melting point to prevent particle adhesion upon contact with the substrate 102 and/or any layers formed thereon. For example, the micro-blasting process is performed utilizing powder particles 205 formed of a ceramic material. In one embodiment, the powder particles 205 utilized in the micro-blasting process are formed of aluminum oxide (Al$_2$O$_3$). In another embodiment, the powder particles 205 are formed of silicon carbide (SiC). Other suitable materials for the powder particles 205 are also contemplated. The powder particles 205 generally range in size between about 15 μm and about 60 μm in diameter, such as between about 20 μm and about 40 μm in diameter. For example, the powder particles 205 are an average particle size of about 27.5 μm in diameter. In another example, the powder particles 205 have an average particle size of about 23 μm in diameter.

The effectiveness of the micro-blasting process at operation 120 further depends on the material characteristics of the resist layer 104. Utilizing a material having too high of a Shore A Scale hardness may cause unwanted ricocheting of the powder particles 205 between sidewalls of the resist layer 104, thus reducing the velocity upon which the powder particles 205 bombard the substrate 102, and ultimately reducing the effectiveness of the powder particles 205 in eroding or dislodging exposed regions of the substrate 102. Conversely, utilizing a material having too low of a Shore A Scale hardness may cause unwanted adhesion of the powder particles 205 to the resist layer 104. It is contemplated that a Shore A Scale hardness value of between about 40 and about 90 is utilized for the resist layer 104 material, as described above.

In embodiments where the resist layer 104 is a photoresist such as depicted in FIG. 2C, the substrate 102 remains unexposed at the start of operation 130. Thus, the powder particles 205 first bombard a surface of the resist layer 104, causing material from the UV-exposed and structurally weakened portions of the photoresist to be dislodged and removed. The powder particles 205 eventually penetrate through and remove the brittle UV-exposed portions to form voids in the resist layer 104, thus exposing desired regions of the substrate 102 while other regions remain shielded by the UV-unexposed portions of the photoresist. Micro-blasting is then continued until the powder particles 205 dislodge and remove a desired amount or depth of material from the exposed regions of the substrate 102, thus forming a desired pattern in the substrate 102.

In embodiments where the resist layer 104 is patterned by laser ablation, such as depicted in FIG. 3C, desired regions of the substrate 102 are already exposed through voids in the resist layer 104 prior to the micro-blasting at operation 130. Thus, minimal or no removal of the resist layer 104 is contemplated at operation 130 during the micro-blasting process. In one embodiment, the micro-blasting process is optional, and laser ablation alone may be utilized to pattern the substrate 102.

Figure 2D:
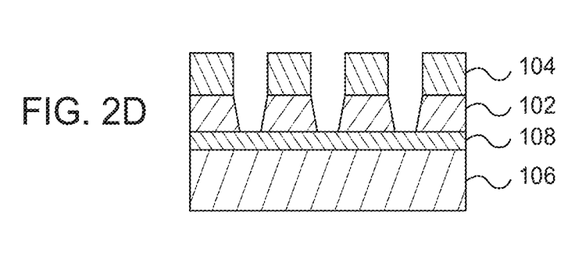
Figure 3D:
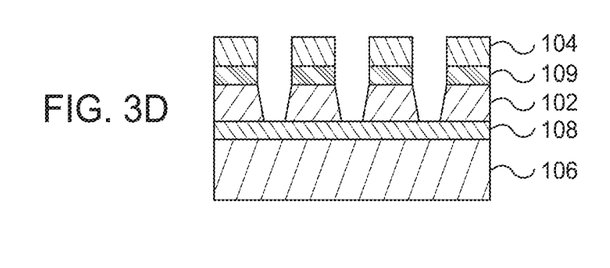

At operation 140, corresponding to FIGS. 2D and 3D, after a desired pattern has been micro-blasted into the substrate 102, the substrate 102 is exposed to an etch process. The etch process at operation 140 is utilized to smoothen the surfaces of the substrate 102 and remove any unwanted mechanical defects thereon. The etch process proceeds for a predetermined duration of time to planarize the surfaces of the substrate 102, and particularly the surfaces exposed to the micro-blasting process at operation 130. In one aspect, the etch process at operation 140 is utilized to remove undesired debris remaining from the micro-blasting process at operation 130. Leftover powder particles 205 adhering to the substrate 102 may be removed during the etch process at operation 140.

In one embodiment, the etch process at operation 140 is a wet etch process utilizing a buffered etch process preferentially etching the substrate surface over the material of the resist layer 104. For example, the buffered etch process may be selective for polyvinyl alcohol. In one embodiment, the etch process is a wet etch process utilizing an aqueous etch process. Any suitable wet etchant or combination of wet etchants may be used for the wet etch process. In one embodiment, the substrate 102 is immersed in an aqueous HF etching solution for etching. In other embodiments, the substrate 102 is immersed in an aqueous KOH etching solution for etching. In one embodiment, the etching solution is heated to a temperature between about 40° C. and about 80° C. during the etch process, such as between about 50° C. and about 70° C. For example, the etching solution is heated to a temperature of about 60° C. The etch process may further be isotropic or anisotropic. In one embodiment, the etch process at operation 140 is a dry etch process. An example of a dry etch process includes a plasma-based dry etch process.

Figure 2E:
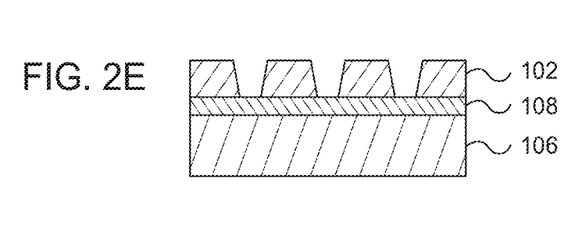
Figure 3E:
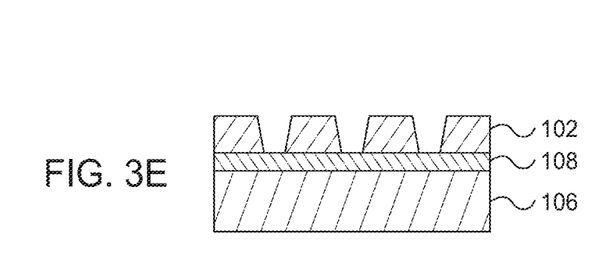

At operation 150, corresponding to FIGS. 2E and 3E, the substrate 102 is exposed to a resist stripping process. The stripping process at operation 150 is utilized to de-bond the resist layer 104 from the substrate 102. In one embodiment, a wet process is used to de-bond the resist layer 104 from the substrate 102 by dissolving/solubilizing the resist adhesive layer 109 and/or the resist layer 104. Other types of etch process are further contemplated for releasing the resist adhesive layer 109 and/or the resist layer 104. In one embodiment, a mechanical rolling process is used to de-bond the resist layer 104 from the substrate 102 by physically peeling off the resist layer 104 or the resist adhesive layer 109. In one embodiment, an ashing process is used to remove the resist layer 104 from the substrate 102 by use of, for example, an oxygen plasma assisted process.

Figure 2F:
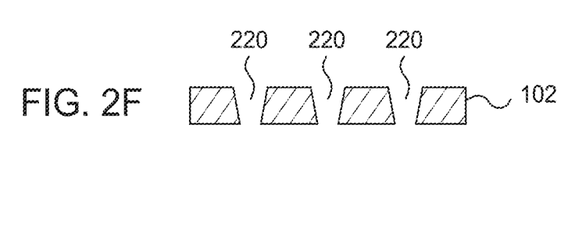
Figure 3F:
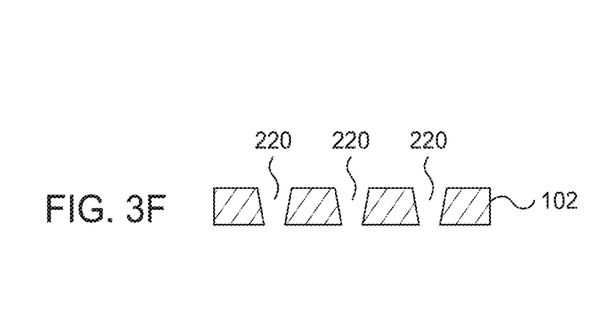

At operation 160, corresponding to FIGS. 2F and 3F, the substrate 102 is exposed to an optional carrier de-bonding process. The utilization of the carrier de-bonding process is dependent on whether the substrate 102 is coupled to the carrier plate 106 and the type of bonding material utilized to couple the substrate 102 thereto. As described above and depicted in FIGS. 2A-2F and 3A-3F, in embodiments where the substrate 102 has a thickness of less than about 200 μm, the substrate is coupled to the carrier plate 106 for mechanical support during the substrate structuring process 100. In some embodiments, the substrate 102 is coupled to the carrier plate 106 via the adhesive layer 108. Thus, at operation 160, the substrate 102 coupled to the carrier plate 106 is exposed to the carrier de-bonding process to de-bond the substrate 102 from the carrier plate 106 by releasing the adhesive layer 108.

In one embodiment, the adhesive layer 108 is released by exposing the substrate 102 to a bake process. In one embodiment, the substrate 102 is exposed to temperatures between about 50° C. and about 300° C., such as temperatures between about 100° C. and about 250° C. For example, the substrate 102 is exposed to a temperature of between about 150° C. and about 200° C., such as about 160° C. for a desired period of time to release the adhesive layer 108. In other embodiments, the adhesive layer 108 is released by exposing the substrate 102 to UV radiation.

FIGS. 2F and 3F illustrate the structured substrate 102 after completion of the method 100. The substrate 102 depicted in FIGS. 2F and 3F has three structures 220 formed therethrough. The method 100 is utilized to form patterned structures 220 in the substrate 102 having various desired depths, dimensions, and shapes. In one embodiment, the structures 220 have a depth equal to the thickness of the substrate 102, thus forming a hole through two opposing surfaces of the substrate 102. In one embodiment, the structures 220 have a depth less than the thickness of the substrate 102, thus forming a hole in only one surface of the substrate 102. For example, a structure 220 formed in the substrate 102 may have a depth of between about 10 μm and about 600 μm, such as a depth of between about 25 μm and about 200 μm, depending upon the thickness of the substrate 102. In one embodiment, the structures 220 have lateral dimensions ranging between about 20 μm and about 15 mm, such as about 50 μm and about 5 mm, depending on the dimensions of the substrate 102. In one embodiment, the structures 220 formed in the substrate 102 have a spheroid or conical shape. In another embodiment, the structures 220 formed in the substrate 102 have a cuboid shape. It is contemplated that the structures 220 formed by the method 100 may have any desired shape, dimensions, and depth as allowed by the substrate 102.

FIGS. 4A-4E illustrate schematic, cross-sectional views of the substrate 102 during an alternative structuring sequence similar to the embodiments described above. The alternative sequence depicted in FIGS. 4A through 4E involves patterning the substrate 102 on two major opposing surfaces as compared to only one surface, thus enabling increased efficiency during structuring of the substrate 102. The substrate structuring sequence depicted in FIGS. 4A-4E includes substantially all of the features and operations as described with reference to FIG. 1, FIGS. 2A-2F, and FIGS. 3A-3F. For example, FIG. 4A corresponds to operation 110 and FIGS. 2A and 3A, FIG. 4B corresponds to operation 120 and FIGS. 2B and 3B, FIG. 4C corresponds to the operation 130 and FIGS. 2C and 3C, FIG. 4D corresponds to the operation 140 and FIGS. 2D and 3D, and FIG. 4E corresponds to the operation 150 and FIGS. 2F and 3F. However, unlike the previous embodiments, the embodiment depicted in FIGS. 4A-4E includes a substrate 102 having two resist layers 104 formed on opposing surfaces 405, 407 thereof, enabling structuring operations to be performed on both surfaces 405, 407.

Figure 4A:
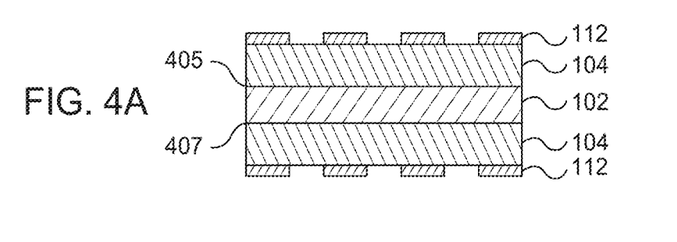
FIGS. 4A-4E schematically illustrate cross-sectional views of a substrate at different stages of a substrate structuring process according to an embodiment described herein.
Figure 4B:
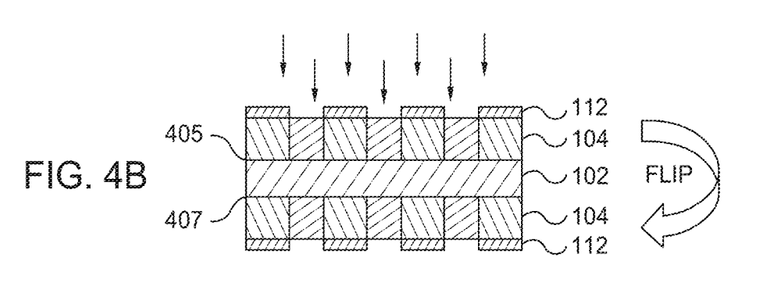
Figure 4C:
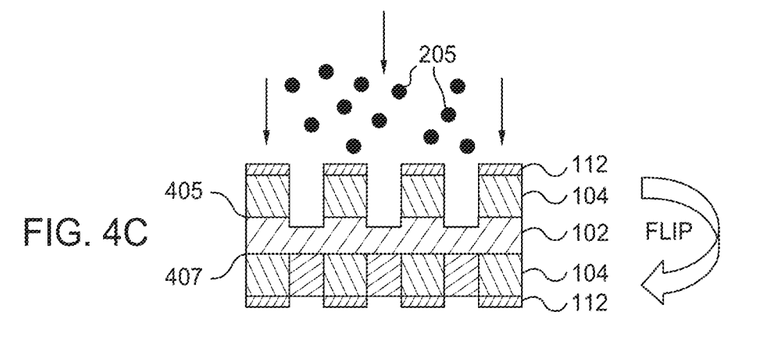
Figure 4D:
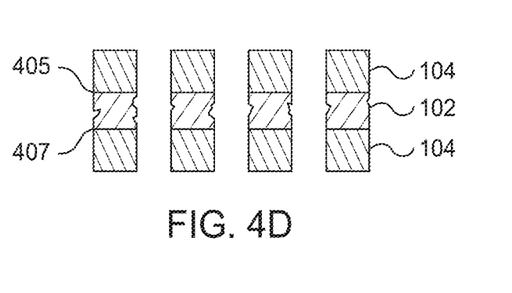
Figure 4E:
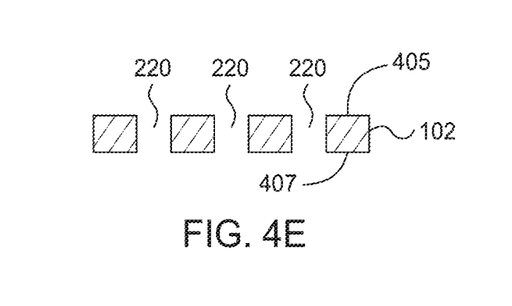

For example, after exposing the resist layer 104 formed on surface 405 of the substrate 102 to the electromagnetic radiation for patterning at operation 120, the substrate 102 is optionally flipped (e.g., turned over) so that the resist layer 104 on the opposing surface 407 of the substrate 102 may be exposed to the electromagnetic radiation for patterning, as depicted in FIG. 4B. Similarly, after performing the micro-blasting process of operation 130 on surface 405 of the substrate 102, the substrate 102 may be optionally flipped again so that micro-blasting may be performed on the opposing surface 407 of the substrate 102, as depicted in FIG. 4C. By utilizing two resist layers 104 on opposing surfaces 405, 407 of the substrate 102 and performing the micro-blasting process against both surfaces, tapering of structures formed through the entire thickness of the substrate 102 during micro-blasting may also be reduced or eliminated.

Figure 5:
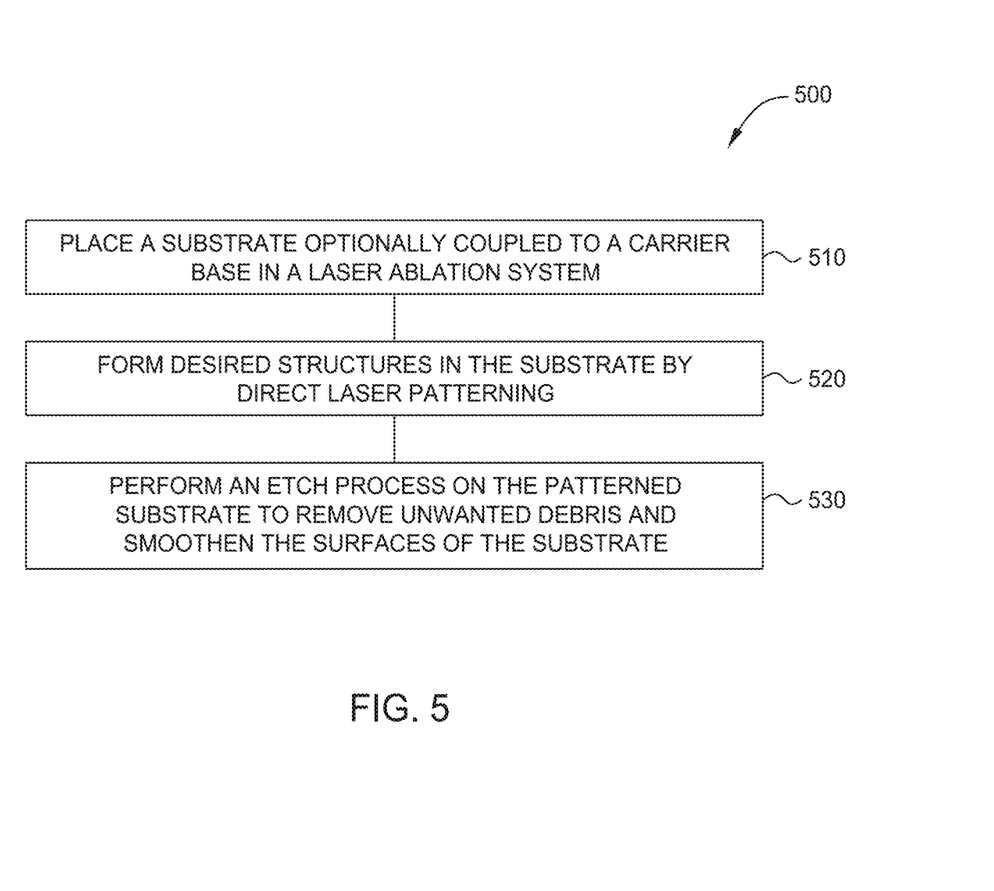
FIG. 5 illustrates a flow diagram of a substrate structuring process according to an embodiment described herein FIGS. 6A-6D schematically illustrate cross-sectional views of a substrate at different stages of a substrate structuring process according to an embodiment described herein.

FIG. 5 illustrates a flow diagram of another representative method 500 for structuring the substrate 102. FIGS. 6A-6D illustrate schematic, cross-sectional views of the substrate 102 at different stages of the structuring process of FIG. 5. Thus, reference to FIGS. 6A-6D will be included in the discussion of FIG. 5 and the method 500 where warranted. Similar to the methods described above, the method 500 for structuring the substrate 102 has multiple operations. The operations can be carried out in any order or simultaneously (except where the context excludes the possibility), and the method can include one or more other operations which are carried out before any of the defined operations, between two of the defined operations, or after all the defined operations (except where the context excludes the possibility).

In general, the method 500 includes placing the substrate 102 on a stand 606 of a laser ablation system at operation 510. In some embodiments, the substrate 102 is optionally coupled to a carrier plate prior to placement on the stand 606. At operation 520, the substrate 102 is exposed to laser radiation to pattern the substrate 102 and form desired features therein. At operation 530, the substrate 102 exposed to an etch process to remove debris and surface micro-cracks caused by the laser patterning. In embodiments where the substrate 102 is coupled to a carrier plate, the substrate 102 is further de-bonded from the carrier plate upon performing the etch process.

Figure 6A:
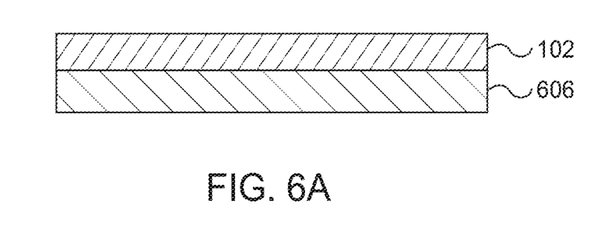

As depicted in FIG. 6A and corresponding with operation 510, the substrate 102, such as a solar substrate, is placed on a stand 606 of a laser ablation system (not shown). The stand 606 may be any suitable rigid and planar surface for providing mechanical support for the substrate 102 during laser ablation. In some embodiments, the stand 606 includes an electrostatic chuck for electrostatic chucking of the substrate 102 to the stand 606. In some embodiments, the stand 606 includes a vacuum chuck for vacuum chucking of the substrate 102 to the stand 606.

Figure 6B:
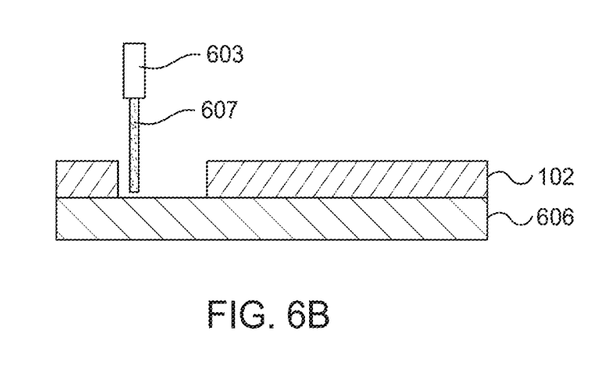

After placing the substrate 102 on the stand 606, a desired pattern is formed in the substrate 102 by laser ablation, depicted in FIG. 6B and corresponding with operation 520. The laser ablation system may include any suitable type of laser source 603 for patterning the substrate 102. In some examples, the laser source 603 is an infrared (IR) laser. In some examples the laser source 603 is a picosecond UV laser. In other examples, the laser source 603 is a femtosecond UV laser. In yet other examples, the laser source 603 is a femtosecond green laser. The laser source 603 generates a continuous or pulsed laser beam 607 for patterning of the substrate 102. For example, the laser source 603 may generate a pulsed laser beam 607 having a frequency between 100 kHz and 1200 kHz, such as between 200 kHz and about 1000 kHz. The laser source 603 is configured to form any desired pattern and features in the substrate 102, including cavities and vias.

Figure 6C:
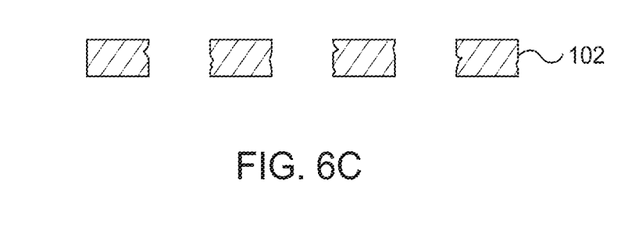
Figure 6D:
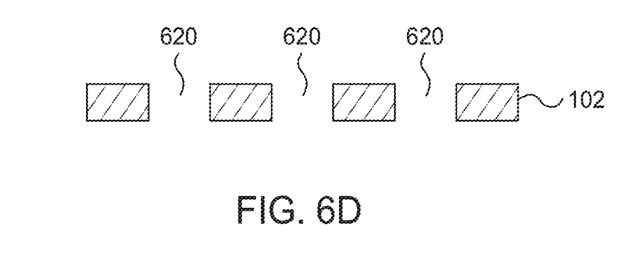

Similar to micro-blasting, the process of direct laser patterning of the substrate 102 may cause unwanted mechanical defects on the surfaces of the substrate 102, including chipping and cracking. Thus, after forming desired features in the substrate 102 by direct laser patterning, the substrate 102 is exposed to an etch process at operation 530 substantially similar to the etch process described with reference to operation 140 to remove any remaining debris and smoothen the surfaces of the substrate 102. FIGS. 6C-6D illustrate the substrate 102 before and after performing the etch process, which concludes with the structured substrate 102 having three features 620 (e.g., vias) formed therein.

The embodiments described herein advantageously provide improved methods of substrate structuring for advanced integrated circuit packaging. By utilizing the methods described above, high aspect ratio features may be formed on glass and/or silicon substrates with substantially reduced manufacturing costs, which can be utilized as an economical alternative to silicon interposers.

While the foregoing is directed to embodiments of the present disclosure, other and further embodiments of the disclosure may be devised without departing from the basic scope thereof, and the scope thereof is determined by the claims that follow.

What is claimed is:

1. A method for substrate structuring, comprising:
   bonding a silicon substrate to a carrier plate, the substrate bonded to the carrier plate via a first adhesive layer;
   forming a resist layer on the substrate;
   patterning the resist layer;
   patterning the substrate to form one or more cavities and one or more vias therein;
   exposing the substrate to an etch process to remove debris from the cavities and vias, the etch process further smoothening one or more surfaces of the substrate;
   removing the resist layer from the substrate; and
   de-bonding the substrate from the carrier plate by releasing the first adhesive layer.

2. The method of claim 1, wherein the substrate is patterned via micro-blasting or laser ablation.

3. The method of claim 2, wherein the micro-blasting comprises propelling a plurality of powder particles toward the substrate at a velocity between about 300 m/s and about 1000 m/s utilizing a fluid stream of inert gas.

4. The method of claim 3, wherein the inert gas comprises helium, argon, or nitrogen.

5. The method of claim 3, wherein the powder particles comprise a ceramic material.

6. The method of claim 5, wherein the powder particles comprise aluminum oxide or silicon carbide.

7. The method of claim 3, wherein the powder particles range in size between about 15 μm and about 60 μm in diameter.

8. The method of claim 2, wherein the laser ablation is performed using an infrared (IR) laser.

9. The method of claim 2, wherein the laser ablation is performed using a picosecond ultraviolet (UV) laser.

10. The method of claim 2, wherein the laser ablation is performed using a femtosecond ultraviolet (UV) laser.

11. The method of claim 2, wherein the laser ablation is performed using a femtosecond green laser.

12. The method of claim 2, wherein the laser ablation is performed using a pulsed laser beam having a frequency between about 100 kHz and about 1200 kHz.

13. The method of claim 12, wherein the laser ablation is performed using a pulsed laser beam having a frequency between about 200 kHz and about 1000 kHz.

14. A method for substrate structuring, comprising:
    bonding a silicon substrate to a carrier plate, the substrate bonded to the carrier plate via a first adhesive layer;
    forming and patterning a resist layer on a silicon substrate;
    patterning the substrate through the resist layer via laser ablation to form one or more structured patterns therein;
    exposing the substrate to an etch process to remove debris from the structured patterns in the substrate; and
    de-bonding the substrate from the carrier plate by releasing the first adhesive layer.

15. The method of claim 14, wherein the resist layer is a photoresist patterned by selective exposure to UV radiation through a mask.

16. The method of claim 14, wherein the resist layer is patterned by laser ablation.

17. The method of claim 14, wherein the laser ablation is performed using an infrared (IR) laser.

18. The method of claim 14, wherein the laser ablation is performed using a picosecond or femtosecond ultraviolet (UV) laser.

19. The method of claim 14, wherein the laser ablation is performed using a femtosecond green laser.

20. A method for substrate structuring, comprising:
    bonding a silicon substrate to a carrier plate, the substrate bonded to the carrier plate via a first adhesive layer;
    forming and patterning resist layer on the substrate, the resist layer bonded to the substrate via a second adhesive layer;
    patterning the substrate via infrared (IR) laser ablation to form one or more cavities and one or more vias therein;
    exposing the substrate to an etch process to remove debris from the cavities and vias, the etch process further smoothening one or more surfaces of the substrate;
    removing the resist layer from the substrate by releasing the second adhesive layer; and
    de-bonding the substrate from the carrier plate by releasing the first adhesive layer.

* * * * *